(12) United States Patent
Hsu et al.

(10) Patent No.: US 12,386,618 B2
(45) Date of Patent: Aug. 12, 2025

(54) MULTI-BUFFERED REGISTER FILES WITH SHARED ACCESS CIRCUITS

(71) Applicant: Intel Corporation, Santa Clara, CA (US)

(72) Inventors: Steven Hsu, Lake Oswego, OR (US); Amit Agarwal, Hillsboro, OR (US); Debabrata Mohapatra, Santa Clara, OR (US); Arnab Raha, Santa Clara, CA (US); Moongon Jung, San Jose, CA (US); Gautham Chinya, Sunnyvale, CA (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 958 days.

(21) Appl. No.: 17/132,895

(22) Filed: Dec. 23, 2020

(65) Prior Publication Data

US 2021/0117197 A1 Apr. 22, 2021

(51) Int. Cl.
*G06F 9/30* (2018.01)
*G06F 13/16* (2006.01)
*G06F 15/78* (2006.01)
*G06N 3/04* (2023.01)

(52) U.S. Cl.
CPC ...... *G06F 9/30123* (2013.01); *G06F 9/30101* (2013.01); *G06F 9/3012* (2013.01); *G06F 9/3013* (2013.01); *G06F 9/30141* (2013.01); *G06F 13/1689* (2013.01); *G06F 15/7807* (2013.01); *G06N 3/04* (2013.01)

(58) Field of Classification Search
CPC .. G06F 9/3012; G06F 9/30123; G06F 9/3013; G06F 9/30141; G06F 15/7807
See application file for complete search history.

(56) References Cited

U.S. PATENT DOCUMENTS

| | | | | |
|---|---|---|---|---|
| 5,289,584 | A * | 2/1994 | Thome | G06F 12/0879 365/219 |
| 5,428,754 | A * | 6/1995 | Baldwin | G06F 1/08 712/30 |
| 5,821,950 | A * | 10/1998 | Rentschler | G06T 1/20 345/503 |
| 2002/0026545 | A1* | 2/2002 | Yoshida | G06F 9/3875 712/E9.058 |
| 2014/0223101 | A1* | 8/2014 | Jackson | G06F 9/3012 711/125 |
| 2018/0307438 | A1* | 10/2018 | Huang | G06F 7/523 |
| 2019/0171448 | A1* | 6/2019 | Chen | G06F 9/30036 |
| 2020/0089506 | A1* | 3/2020 | Power | G06N 3/045 |

(Continued)

OTHER PUBLICATIONS

Extended European Search Report for European Patent Application No. 21197717.8, mailed Feb. 24, 2022, 7 pages.

(Continued)

*Primary Examiner* — Jacob Petranek
(74) *Attorney, Agent, or Firm* — Akona IP PC

(57) ABSTRACT

Systems, apparatuses and methods identify a plurality of registers that are associated with a system-on-chip. The plurality of registers includes a first portion dedicated to write operations and a second portion dedicated to read operations. The technology writes data to the first portion of the plurality of registers, and transfers the data from the first portion to the second portion.

22 Claims, 8 Drawing Sheets

(56) References Cited

U.S. PATENT DOCUMENTS

| | | |
|---|---|---|
| 2020/0134417 A1 | 4/2020 | Mohapatra et al. |
| 2020/0228137 A1 | 7/2020 | Chinya et al. |
| 2020/0410327 A1 | 12/2020 | Chinya et al. |
| 2021/0042617 A1 | 2/2021 | Chinya et al. |
| 2021/0109753 A1* | 4/2021 | Anderson ............. G06F 1/3287 |

OTHER PUBLICATIONS

Chen et al., "Eyeriss: An energy-efficient reconfigurable accelerator for deep convolutional neural networks," 2016 IEEE International Solid-State Circuits Conference (ISSCC), San Francisco, CA, 2016, pp. 262-264.

Chen et al., "Using Dataflow to Optimize Energy Efficiency of Deep Neural Network Accelerators," in IEEE Micro, vol. 37, No. 3, May/Jun. 2017, pp. 12-21.

Jouppi et al., "In-datacenter performance analysis of a tensor processing unit," 2017 ACM/IEEE 44th Annual International Symposium on Computer Architecture (ISCA), Toronto, ON, 2017, 17 pages.

* cited by examiner

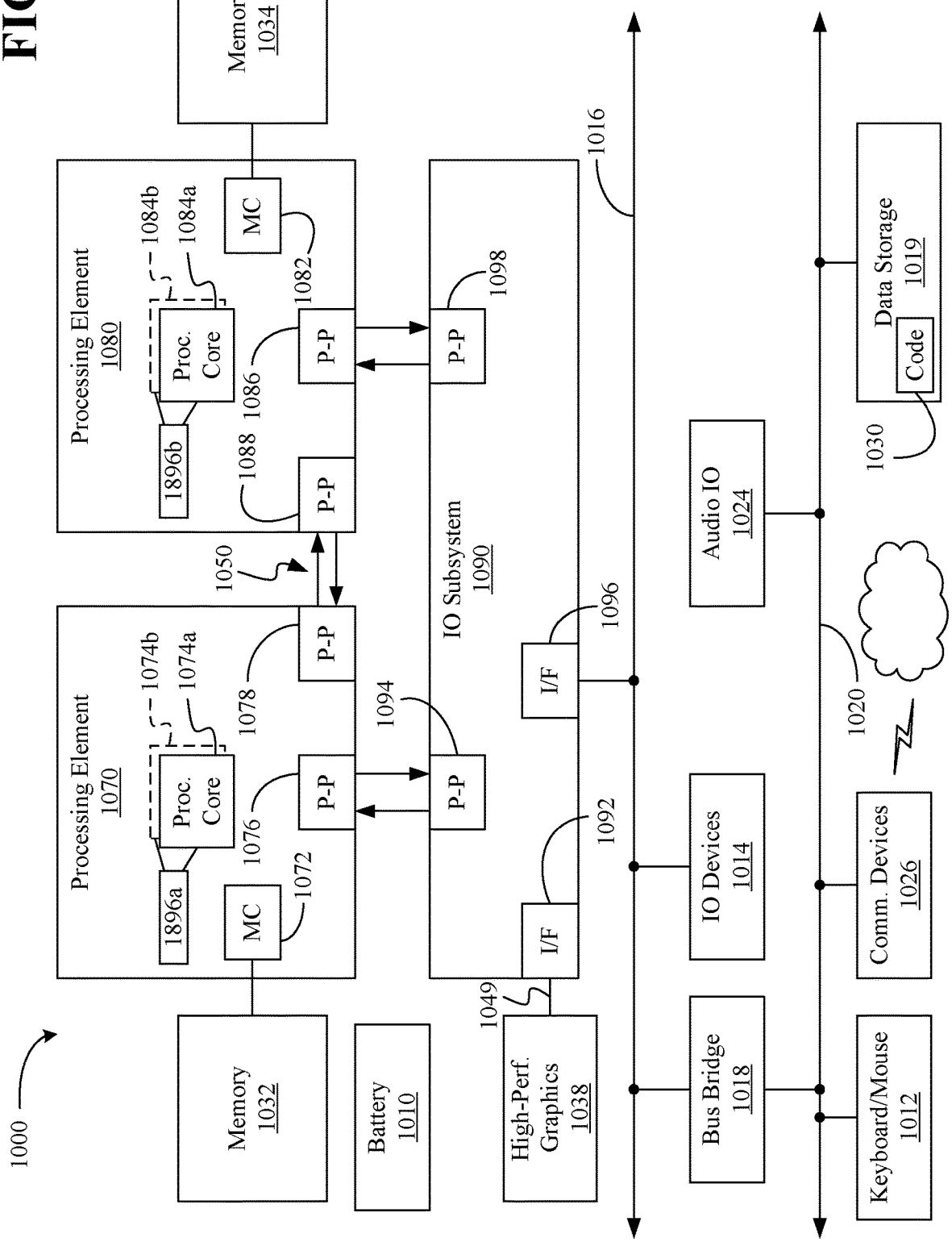

MULTI-BUFFERED REGISTER FILES WITH SHARED ACCESS CIRCUITS

TECHNICAL FIELD

Embodiments generally relate to multi-buffered (e.g., double-buffered) memory implementations. More particularly, embodiments relate to shared access circuitry (e.g., read/write access circuitry) associated with the multi-buffered memory implementations.

BACKGROUND

In an attempt to meet workload demands, some examples increase different types of processing units or elements (e.g., multiply-and-accumulate (MAC) units) to increase processing power. The processing units may nonetheless suffer from degraded performance due to blocking caused by high latency data fetch and/or memory access operations. Thus, merely scaling compute power may not yield performance gains. Indeed, including idle processing units may be detrimental to the overall power/energy of the system since idling processing units may increase the leakage component, increase hardware costs and a size of an overall package.

BRIEF DESCRIPTION OF THE DRAWINGS

The various advantages of the embodiments will become apparent to one skilled in the art by reading the following specification and appended claims, and by referencing the following drawings, in which:

FIG. 9 is a block diagram of an example of a multi-processor based computing system according to an embodiment.

DESCRIPTION OF EMBODIMENTS

Figure 1:
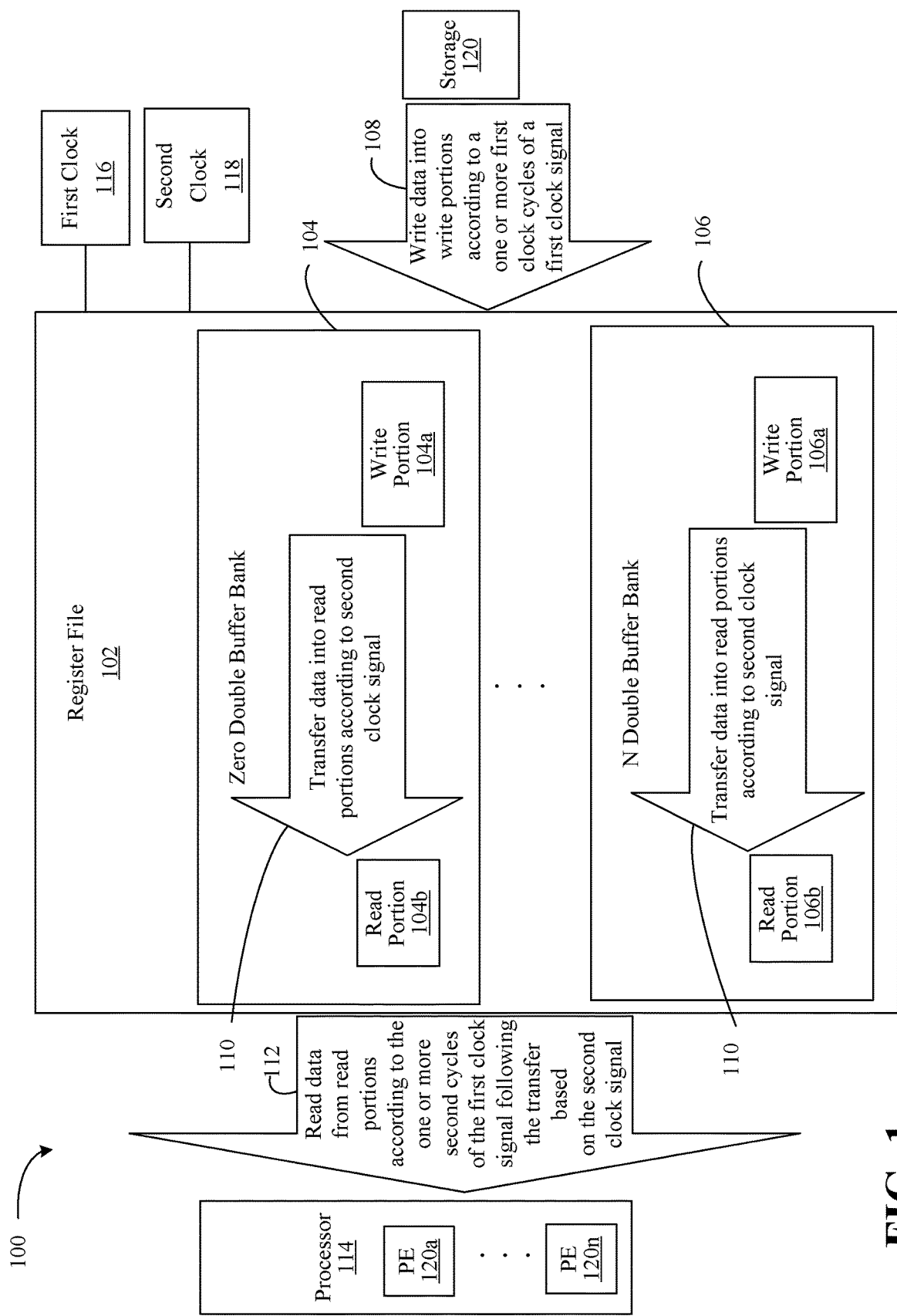
FIG. 1 is a process flow diagram of an example of a multi-buffered memory access according to an embodiment.

Turning now to FIG. 1, a multi-buffered memory access process 100 is illustrated that provides a flexible schedule based approach of data movements to reduce overall memory circuitry and latency of memory fetches. The process 100 may move data from lower levels of memory, such as storage 120, to higher levels of a memory hierarchy such as register file 102 (e.g., a hardware register) having dedicated write portions 104a, 106a and read portions 104b, 106b. The register file 102 may include a number of data banks, including the zero double buffer bank 104 and the N double buffer bank 106. The register file 102 may include shared read-write circuitry to store data and reduce blocking of the processor 114 due to memory accesses, while also reducing an overall size of the register file 102.

The process 100 may include writing data from storage 120 into write portions 104a, 106a according to one or more first clock cycles of a first clock signal 108 of the first clock 116. The register file 102 may be a local storage (e.g., memory device) of a processor 114 (e.g., on-chip registers) and may be allocated close to compute processing elements 120a-120n. The register file 102 may be accessed more frequently than distant, higher levels of memory hierarchy such as storage 120 (e.g., compute-near-Memory) which may be a static random-access memory (SRAM) and/or dynamic random access memory (DRAM). Thus, some embodiments include register files 102 that are close to processing elements 120a-120n to enable reuse of data to bypass higher latency memory fetches.

The process 100 may include transferring data into read portions 104b, 106b according to a second clock signal (e.g., a pulse) of the second clock 118, 110. Each clock cycle of the second clock signal may correspond (e.g., may be as long as) several cycles of the first clock signal. In some embodiments, the second clock 118 may be omitted and the second clock signal may be a modified version of the first clock signal. The second clock signal is different from the first clock signal to avoid overwriting data in the read portions 104b, 106b that is not yet read by the processor 114. After the data in the read portions 104b, 106b is read by the processor 114, new data may be transferred (e.g., according to the second clock signal) from the write portions 104a, 106a to overwrite the data in the read portions 104b, 106b and be stored in the read portions 104b, 106b. In some embodiments, the second clock signal is timed to cause transfer of data from the write portions 104a, 106a to the read portions 104b, 106b between read operations of the read portions 104b, 106b by the processor 114, and write operations of data from storage 120 to the write portion 104a, 106a. The data may be transferred from the write portions 104a, 106a to the read portions 104b, 106b in one cycle of the second clock signal.

Process 100 may further read data from read portions 104b, 106b, according to one or more second clock cycles of the first clock signal following (e.g., immediately subsequent to) the transfer based on the second clock signal 112. For example, the processor 114 may read the data stored in read portions 104b, 106b to execute operations based on the data with the PE 120a-120n. In some embodiments, the processor 114 may only be able to access the read portions 104b, 106b and not the write portions 104a, 106a. Further, data from the storage 120 may only be directly written into the write portions 104a, 106a and not the read portions 104b, 106b. Doing so may be reduce the circuitry for accessing the zero double buffer bank 104 and the N double buffer bank 106 since duplicative circuitry may be eliminated. Thus, the write portions 104a, 106a may be dedicated to write operations from the storage 120, while the read portion 104b, 106b may be dedicated to read operations from the processor 114.

For example, the write portions 104a, 106a may receive data that is external to the register file 102 and from elements external to the register file 102. The write portions 104a, 106a may not be read by elements external to the register file 102. The read portions 104b, 106b may be read by elements external to the register file 102, but may not be written to by elements external to the register file 102. Data may be transferred internally within the register file 102 from the write portions 104a, 106a to the read portions 104b, 106b, but as noted, external elements may have limited interactions with the write portions 104a, 106a to bypass reading the write portions 104a, 106a, and bypass writing to the read portions 104b, 106b.

During consecutive clock cycles of the first clock signal of first clock 116, data may be written into the write portions 104a, 106a, and read from read portions 104b, 106b. Data may be transferred from the write portions 104a, 106a to the read portions 104b, 106b between portions of the clock cycles (e.g., between phases) of the first clock 116 to avoid data errors such as overwriting. For example, data may be written into the write portions 104a, 106a during one or more first clock cycles of the first clock signal. During subsequent clock cycles, the loaded data may be transferred from the write portions 104a, 106a to the read portions 104b, 106b based on the second clock signal. During one or more subsequent clock cycles of the first clock signal after the second clock signal has transferred data from the write portions 104a, 106a to the read portions 104b, 106b, the processor 114 may read data from the read portions 104b, 106b.

Such operations may repeat over the first and second clock signals. For example, in one or more first clock cycles of the first clock signal, first data may be read from the read portions 104b, 106b (that may have been stored in one or more previous clock cycles of the first clock signal) and second data may be stored in the write portions 104a, 106a from the storage 120. The second data may be transferred from the write portions 104a, 106a to the read portions 104b, 106b according to the second clock signal and to overwrite the first data after the first data is read from the read portions 104b, 106b. In some embodiments, the read of the first data from the read portions 104b, 106b and write of the second data in the write portions 104a, 106a may occur concurrently to avoid overwriting errors.

Thereafter, in one or more second clock cycles of the first clock signal, the second data may be read from the read portions 104b, 106b (that were stored in the one or more first clock cycles) and third data may be stored in the write portions 104a, 106a. The third data may be transferred from the write portions 104a, 106a to the read portions 104b, 106b according to the second clock signal and to overwrite the second data. In some embodiments, the read of the second data from the read portions 104b, 106b and write of the third data may in the write portions 104a, 106a may occur concurrently. Such a process 100 may continue for a plurality of consecutive clock cycles of the first clock signal and the second clock signal.

By including dedicated write portions 104a, 106a, and dedicated read portions 104a, 104b, the register file 102 may be an area-efficient, multi-buffered (e.g., double-buffered) memory with shared read/write circuits to reduce area (e.g., by over 49% or more) over other implementations while reducing waiting by the PEs 120a-120n for memory fetches. Thus, some embodiments enhance throughput at a reduced memory size by sharing the read and write circuitry between the first (e.g., active) register file and a buffered (e.g., shadow) register file to reduce memory size.

In some embodiments, more than one register file 102 may be provided. For example, a plurality of register files 102 may be included depending on the application. For example, if a deep neural network is implemented, first register file may be dedicated to input features (IF), a second register file may be dedicated to filters (FL) a third register file may be dedicated to output features (OF) register (e.g., for calculations that are determined based on the FL and the IF). If the register file 102 is modified to be an OF register, the above process 100 may be reversed so that the processor 114 may write to dedicated write portions, data may be transferred from the write portions to read portions and then transferred to another storage from the read portions.

Thus, some embodiments may maintain high throughput performance at a reduced cost and size by avoiding duplicative hardware overheads implemented by other designs (e.g., a ping-pong double-buffered register file implementations). In some embodiments, the PEs 120a-120n may include deep neural network (DNN) accelerators and/or arithmetic logic units (ALU), graphics accelerators, artificial intelligence accelerators, etc. Some embodiments may be implemented in conjunction with high performance microprocessors, graphics, and other application specific hardware accelerators.

For example, in a higher performance microprocessor, a double-buffered register file such as register file 102 may be an instance of one set of register files being read by the ALU and another set of register files are written to by the ALU in order to achieve computational overlaps for enhancing performance. The process 100 may be implemented in high performance general purpose computing processes, graphics processes, and/or other hardware accelerator processes. Some embodiments may be applicable to artificial intelligence applications such as imaging, video, and speech recognition.

Figure 2:
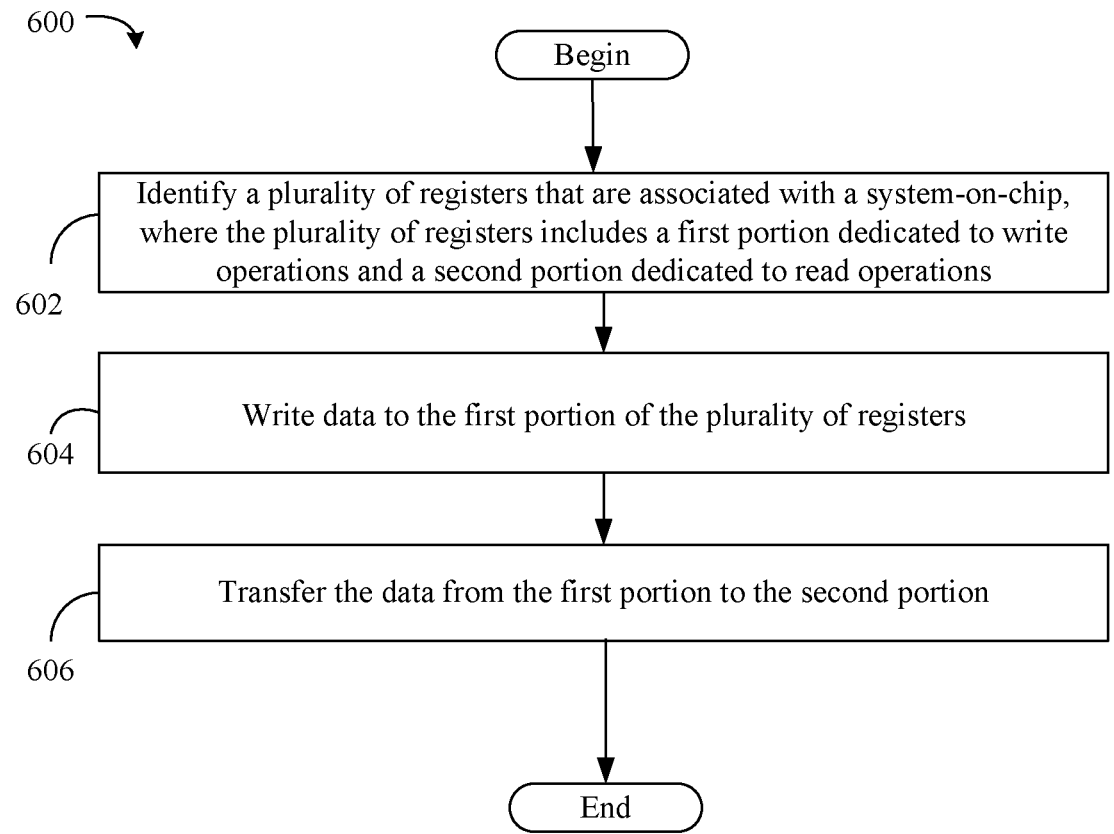
FIG. 2 is a flowchart of an example of a method of accessing multi-buffered registers according to an embodiment.

FIG. 2 shows a method 600 of accessing multi-buffered registers. The method 600 may generally be implemented with the embodiments described herein, for example, the process 100 (FIG. 1), already discussed. In an embodiment, the method 600 is implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 600 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 602 includes identifying a plurality of registers that are associated with a system-on-chip. The plurality of registers includes a first portion dedicated to write operations and a second portion dedicated to read operations. Illustrated processing block 604 writes data to the first portion of the plurality of registers. Illustrated processing block 606 transfers the data from the first portion to the second portion. In some embodiments, the method 600 includes transferring the data in response to a transfer clock pulse being identified. In some embodiments, the method 600 further includes writing the data to the first portion during one or more first clock cycles prior to the transfer clock pulse being identified. In some embodiments, the method 600 further includes reading the data in the first portion during one or more second clock cycles after the transfer clock pulse is identified.

In some embodiments, the plurality of registers includes a first register associated with input features associated with a neural network, a second register associated with filters associated with the neural network, and a third register associated with output features associated with the neural network. In some embodiments, the method 600 further includes in each of a plurality of consecutive clock cycles, retrieving data from a memory and storing the retrieved data in the first portion. Furthermore, some embodiments of the method 600 include in each of a plurality of consecutive clock cycles, reading data from the second portion. In some embodiments, the method 600 further includes controlling read and write operations to the first and second portions based on a first clock signal and transferring data between the first and second portions based on a second clock signal that is different from the first clock signal.

Figures 3A, 3B:
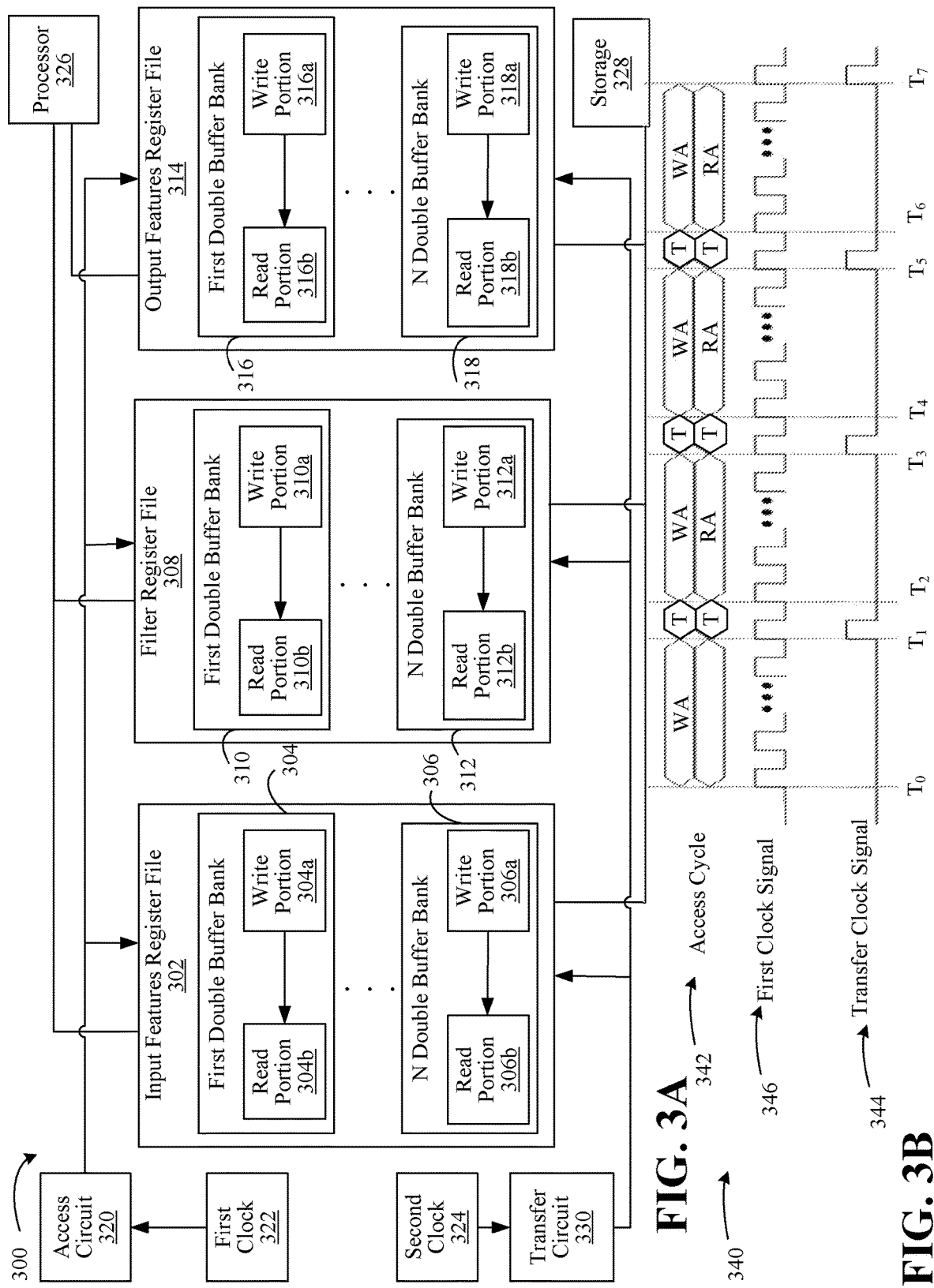
FIG. 3A is a block diagram of an example of a double-buffer register file architecture according to an embodiment.
FIG. 3B is a timing diagram of controlling the double-buffer register file according to an embodiment.

FIG. 3A illustrates a double-buffer register file architecture 300 with shared read and write circuitry. FIG. 3B illustrates timing diagrams 340 of accesses and transfers of data in the architecture 300. Architecture 300 may be associated with a machine learning model such as a DNN and/or CNN. First clock 322 may generate the first clock signal 346 while a second clock 324 may generate the transfer clock signal 344.

As illustrated in FIG. 3A, the architecture 300 includes an input features register file 302, filter register file 308 and output features register file 314. The input features register file 302 includes first double buffer bank 304-N double buffer bank 306. The write portions 304a, 306a may each include one write port in some embodiments, and the read portions 304b, 306b may each include a plurality of read ports (e.g., 4 or more) in some embodiments.

The filter register file 308 includes first double buffer bank 310-N double buffer bank 312. Write portions 310a, 312a may each include one write port in some embodiments, and the read portions 310b, 312b may each include one read port in some embodiments.

The output features register file 314 includes first double buffer bank 316-N double buffer bank 318. Write portions 316a, 318a may each include one write port in some embodiments, and the read portions 316b, 318b may each include one read port in some embodiments.

Access circuit 320 may control write accesses to the input features register file 302, filter register file 308 and output features register file 314. In some embodiments, the access circuit 320 may be a part of the input features register file 302, filter register file 308 and output features register file 314. Furthermore, while the access circuit 320 is shown schematically as one component, it will be understood that other implementations may be possible. For example, each of the input features register file 302, filter register file 308 and output features register file 314 may include different logic that controls write operations and read operations as described herein and similar to the access circuit 320. The access circuit 320 may include hardware, such as configurable logic and/or fixed-functionality hardware logic.

Access circuit 320 may store data from storage 328 (e.g., solid state drive, hard disk drive, SRAM, DRAM, etc.) into the write portions 304a, 306a, 310a, 312a and in accordance with a first clock signal 346 (FIG. 3B) from the first clock 322. The access circuit 320 may store data computed by processor 326 into the write portions 316a, 318a and in accordance with the first clock signal 346. The first clock signal 346 may correspond to access cycles 342 of timing diagram 340 (FIG. 3B). The upper graph of access cycles 342 corresponds to actions (e.g., writes into) associated with the write portions 304a, 306a, 310a, 312a, 316a, 318a and the lower graph of access cycles 342 corresponds to actions (e.g., reads from) associated with the read portions 304b, 306b, 310b, 312b, 316b, 318b. Further, transfers may occur between read and writes. In the example of access cycles 342, the write actives are denoted with a "WA," the read actives are denoted with a "RA," and transfers are denoted with a "T." Multiple reads and writes may occur during each read active and write active respectively. Further, multiple transfers may occur during each transfer. The access circuit 320 may include configurable logic and/or fixed-functionality logic hardware.

Further, the access circuit 320 may control read accesses to the input features register file 302, filter register file 308 and output features register file 314. For example, access circuit 320 may read data out of the read portions 304b, 304b, 310b, 312b in accordance with the first clock signal 346 from the first clock 322 to provide the data to the processor 326. The access circuit 320 may read data computed by processor 326 and stored in the read portions 316b, 318b to store the data to the storage 328 and in accordance with the first clock signal 346.

In some embodiments and as described above, the transfer circuit 330 may transfer data from the write portions 304a, 306a, 310a, 312a, 316a, 318a to the read portions 304b, 304b, 310b, 312b, 316b, 318b in accordance with a transfer clock signal of the second clock 324 during transfer cycles. The transfer clock signal 344 may correspond to transfer cycles of timing diagram 340 (FIG. 3B).

Some embodiments may replace duplicative read-write circuitry that may otherwise be present in each of the two instances of a double-buffer register file with a single write and single read circuitry to control accesses. For instance, the access circuit 320 may include a single write and single read circuitry that is common to the first double buffer bank 304 to access read portion 304b and write portion 304a. Notably, at least part of the write circuitry may not be needed for the read portion 304b since components external to the input features register file 302 do not write to the read portion 304b. Rather, data is transferred internally from the write portion 304a to the read portion 304b. Further, read circuitry may not be needed for the write portion 304a since the write portion 304a is not read by components external to the input features register file 302. Similarly, the access circuit 320 may include a single write and single read circuitry that is common to the N double buffer bank 306 to access the read portion 306b and write portion 306a. The access circuit 320 may similarly include single read write circuitry for the first-N double buffer banks 310-312 and the first-N double buffer banks 316-318.

In some embodiments, the write circuitry of the access circuit 320 only accesses the write portions 304a, 306a, 310a, 312a, 316a, 318a (e.g., active register file bit-cells). Furthermore, in some embodiments the read circuitry of the access circuit 320 is only allowed to access read portions 304b, 306b, 310b, 312b, 316b, 318b (e.g., shadow register file bit-cell).

For example, in access cycles 342, during first clock cycles from $T_0$-$T_1$, first data may be written into write portions 304a, 306a, 310a, 312a from storage 328. Since this is the first clock cycles, the read portions 304b, 306b, 310b, 312b, 316b, 318b do not yet contain data, and thus no data is yet passed to the processor 326. After the first data has been loaded into the write portions 304a, 306a, 310a, 312a, a transfer pulse of transfer clock signal 344 may trigger a transfer from time $T_1$-$T_2$ to move the first data from the write portions 304a, 306a, 310a, 312a to the read portions 304b, 306b, 310b, 312b. In some embodiments, time $T_1$-$T_2$ may overlap with the first clock cycles by avoiding overwriting data that has not yet been read by the processor 326 or transferred to storage 328.

Thereafter, from time $T_2$-$T_3$ during second clock cycles of the first clock signal 346 from time $T_2$-$T_3$, the first data may be read from the read portions 304b, 306b, 310b, 312b by the processor 326. Furthermore, from time $T_2$-$T_3$, second data may be written into the write portions 304a, 306a, 310a, 312a from storage 328. The processor 326 may now being to execute operations based on the first data. After the second data has been loaded into the write portions 304a, 306a, 310a, 312a and the processor 326 has read the first data from the read portions 304b, 306b, 310b, 312b, a transfer pulse may trigger a transfer from time $T_3$-$T_4$ to move the second data from the write portions 304a, 306a, 310a, 312a to the read portions 304b, 306b, 310b, 312b. In some embodiments, time $T_3$-$T_4$ may overlap with the second clock cycles by avoiding overwriting data that has not yet been read by the processor 326 or transferred to storage 328.

Thereafter, from time $T_4$-$T_5$ during third clock cycles of the first clock signal 346, the second data may be read from the read portions 304b, 306b, 310b, 312b by the processor 326. Furthermore, from time $T_4$-$T_5$, third data may be written into the write portions 304a, 306a, 310a, 312a from storage 328. The processor 326 may have completed operations based on the first data and stores the output in the write portions 316a, 318a during the third clock cycles. After the third data and output have been loaded into the write portions 304a, 306a, 310a, 312a, 316a, 318a and the processor 326 has read the second data from the from the read portions 304b, 306b, 310b, 312b, a transfer pulse may trigger a transfer from time $T_5$-$T_6$ to move the third data from the write portions 304a, 306a, 310a, 312a to the read portions 304b, 306b, 310b, 312b, and the output from the write portion 316a, 318a to the read portions 316b, 318b. In some embodiments, the time $T_5$-$T_6$ may overlap with the third clock cycles by avoiding overwriting data that has not yet been read by the processor 326 or transferred to storage 328.

The above process may repeat again starting at time $T_6$ and similar to the above. For example, the read portions 316b, 318b may be read to identify the output and store the output in the storage 328. In some embodiments, the transfer cycles of the transfer clock signal 344 correspond to a clock pulse that triggers the copy of the write portions 304a, 306a, 310a, 312a, 316a, 318a (e.g., active register file bit-cells) to read portions 304b, 306b, 310b, 312b, 316b, 318b (e.g., shadow register file bit-cell). The write portions 304a, 306a, 310a, 312a, 316a, 318a may operate solely in the write phase, while the read portions 304b, 306b, 310b, 312b, 316b, 318b operate solely in the read phase with a pulse of a trigger clock, such as transfer clock signal 344, between the two phases that causes copying of contents from the write portions 304a, 306a, 310a, 312a, 316a, 318a into the read portions 304b, 306b, 310b, 312b, 316b, 318b.

Figure 4:
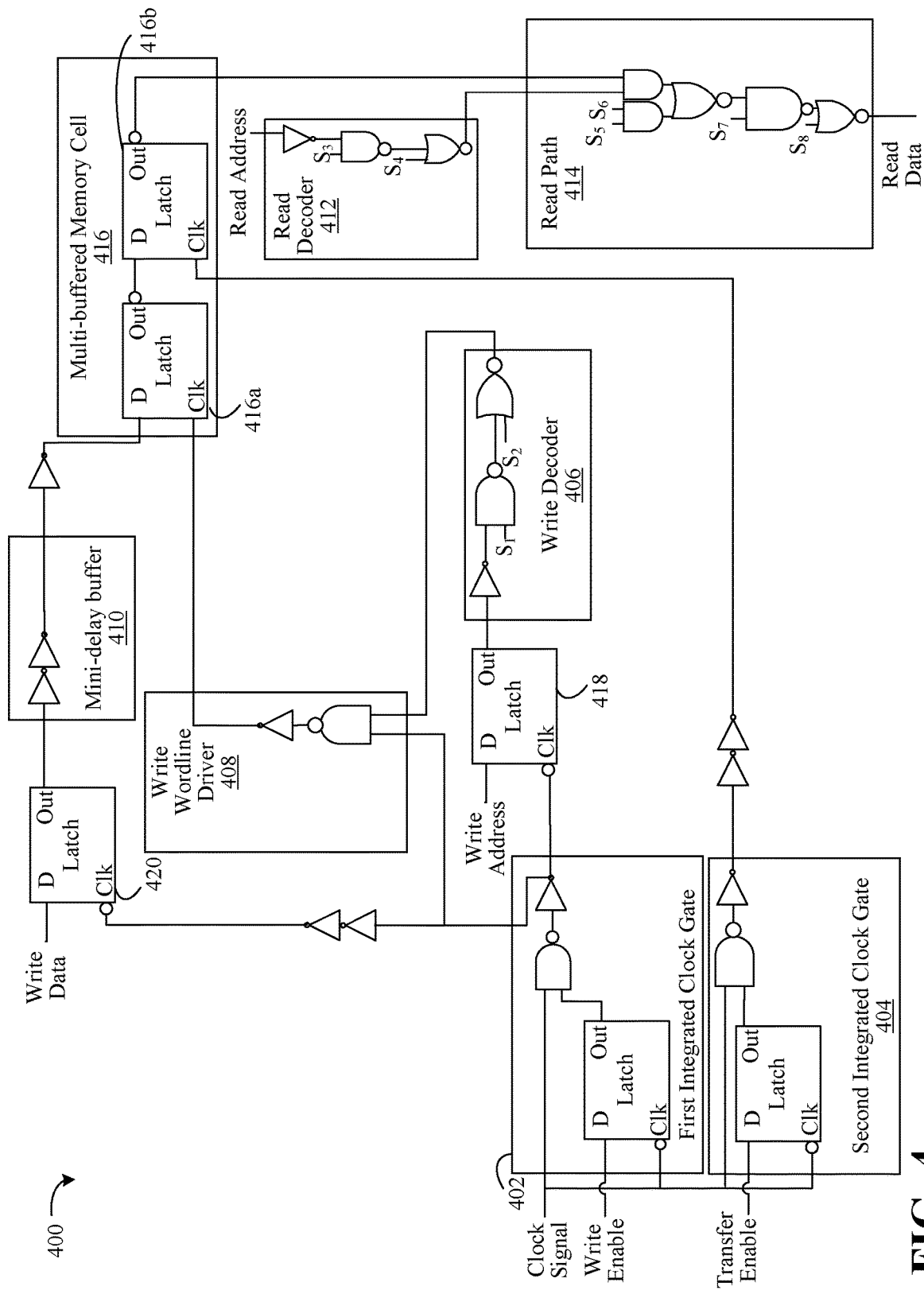
FIG. 4 is an electrical diagram of an example of a double-buffer register file architecture according to an embodiment.

FIG. 4 illustrates an example of a double-buffered register file architecture 400 with shared read/write circuits. As illustrated, a first integrated clock gate 402 may be provided to generate a first clock signal associated with a write portion 416a of the multi-buffered memory cell 416. The write enable signal may be provided to the D input of the latch of the first integrated clock gate 402 and the clock signal may be provided to the clock input of the latch of first integrated clock gate 402.

A write decoder 406 may receive an input of a write address from a latch 418 at a timing corresponding to the first clock signal. The write decoder 406 may provide an output to the write wordline driver 408, which provides an output to the clock input of the write portion 416a. The write data may be transmitted to the multi-buffered memory cell through a mini-delay buffer 410 and a latch 420.

A second integrated clock gate 404 may provide a second clock signal to the clock input of a read portion 416b of the multi-buffered memory cell 416. The data may be transferred from the write portion 416a to the read portion 416b based on a timing of the second clock signal. A read decoder 412 and read path 414 may provide read data from the read portion 416b. In some embodiments, more than one multi-buffered memory cell 416 may utilize the read path 414, and hence more than one AND logic gate may be provided in the read path 414. It is to be noted that the illustrated logic gates show examples of exemplary paths for the various illustrated blocks, such as write decoder 406, read decoder 412 and read path 414. In some embodiments the logic pins associated with signals $S_1$, $S_2$, $S_3$, $S_4$, $S_5$, $S_6$, $S_7$, $S_8$ may be connected to other gate outputs (e.g., other memory cells) which are not shown for clarity to simplify the discussion. The other gate outputs may generate signals $S_1$, $S_2$, $S_3$, $S_4$, $S_5$, $S_6$, $S_7$, $S_8$.

For example, the logic pins in the first AND-OR-Invert (AOI) gate in the read path 414 may be connected to two memory cells, and/or two read wordlines (from read decoder) that produce signals $S_5$, $S_6$. The next NAND gate may receive inputs from two AOI gates, one of which is unillustrated and generates signal $S_7$. The last NOR gate may receive inputs from two NAND gates, one of which is unillustrated and produced signal $S_8$. If the register file has more entries, the read decoder 412 and read path 414 logic may be modified to increase logic depth.

Furthermore, in some embodiments an exposed state node may need to use relative placement so that the exposed state node may be placed next to the first AOI gate of the read path 414, which corresponds to one or more of a plurality of the multi-buffered memory cells 416, may utilize the read path 414. The read decoder 412 may feed into each AND gate of the read path 414 to control the output of the correct multi-buffered memory cell of the multi-buffered memory cells 416.

In some embodiments, some of the components of FIG. 4 may be duplicated. Some embodiments of FIG. 4 include a double-buffered, quad-latch based memory circuit as the multi-buffered memory cell 416, where the double-buffered memory cell contains two latches that correspond to read portion 416b and write portion 416a (e.g., a shadow latch for writing and an active latch for reading). Double-buffered memories may be constructed using quad-latches exposed state node quad latch standard cells.

Figure 5:
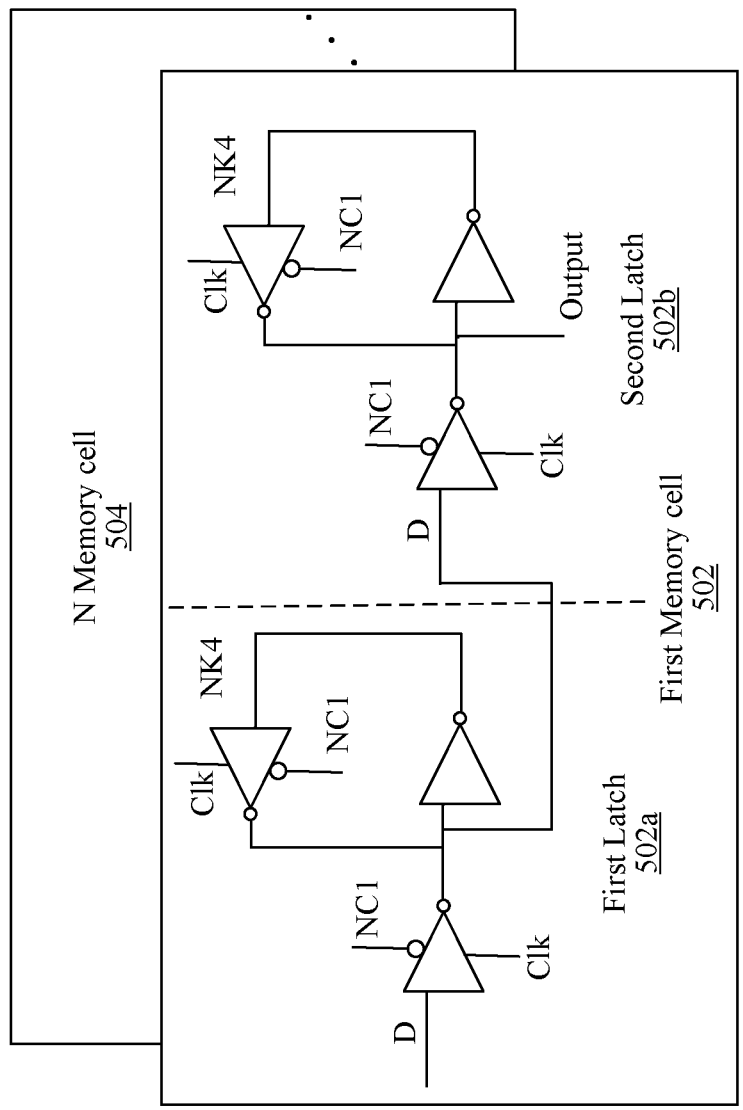
FIG. 5 is an electrical diagram of an example of memory cells of a double-buffer register file architecture according to an embodiment.

FIG. 5 illustrates memory cell 502-N memory cell 504 that may correspond to double-buffered latches. For example, if the memory cells 502-N memory cells 504 are double buffered quad bit latches, there may be four memory cells total (e.g., N=4). As illustrated a first latch 502a may couple with a second latch 502b. The memory cells 502-N memory cells 504 may be readily substituted for the multi-buffered memory cell 416 (FIG. 4).

Figure 6:
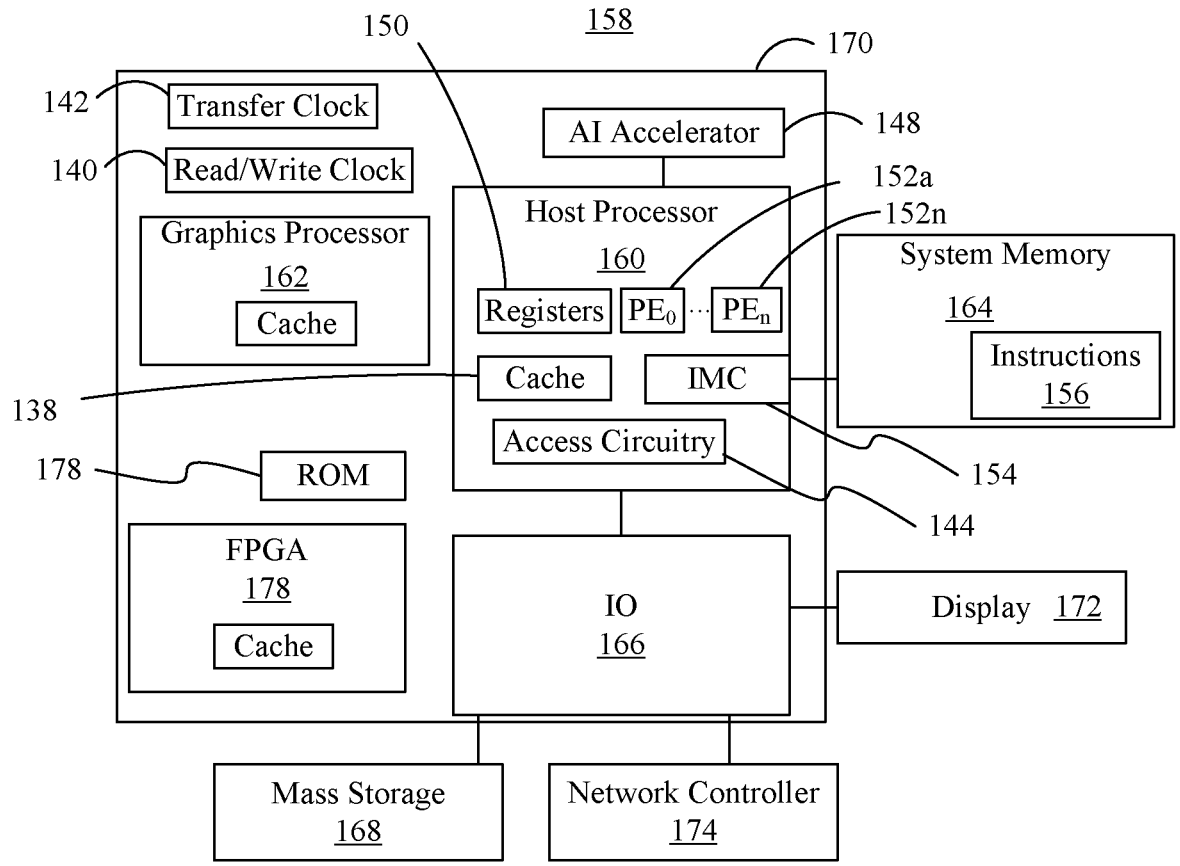
FIG. 6 is a block diagram of an example of a performance-enhanced computing system according to an embodiment.

Turning now to FIG. 6, a performance-enhanced double-buffered memory computing system 158 is shown. The system 158 may generally be part of an electronic device/platform having computing functionality (e.g., personal digital assistant/PDA, notebook computer, tablet computer, convertible tablet, server), communications functionality (e.g., smart phone), imaging functionality (e.g., camera, camcorder), media playing functionality (e.g., smart television/TV), wearable functionality (e.g., watch, eyewear, headwear, footwear, jewelry), vehicular functionality (e.g., car, truck, motorcycle), robotic functionality (e.g., autonomous robot), etc., or any combination thereof. In the illustrated example, the system 158 includes a host processor 160 (e.g., CPU) having an integrated memory controller (IMC) 154 that is coupled to a system memory 164. The host processor 160 includes processing elements including $PE_0$-$PE_n$ 152a-152n that may execute operations based on data on the registers 150 (e.g., hardware registers). The registers 150 may implement a multi-buffer architecture as described herein to include read portions dedicated to providing data to $PE_0$-$PE_n$ 152a-152n, FPGA 178, graphics processor 162 and/or AI accelerator 148. The registers 150 may further include write portions to store data from one or more of a cache 138, system memory 164, cache of the graphics processor 162 or cache of the FPGA 178. The access circuitry 144 may control read and writes to the registers 150 in accordance with a clock signal from a read/write clock 140. The registers 150 may move data from the write portions to the read portions in accordance with a transfer clock signal of transfer clock 142 as described herein.

The illustrated system 158 also includes an input output (IO) module 166 implemented together with the host processor 160 and a graphics processor 162 (e.g., GPU) on a semiconductor die 170 as a system on chip (SoC). The illustrated IO module 166 communicates with, for example, a display 172 (e.g., touch screen, liquid crystal display/LCD, light emitting diode/LED display), a network controller 174 (e.g., wired and/or wireless), and mass storage 168 (e.g., hard disk drive/HDD, optical disk, solid state drive/SSD, flash memory). Furthermore, the SoC 170 may further include processors (not shown) and/or AI accelerator 148 dedicated to artificial intelligence (AI) and/or neural network (NN) processing. For example, the system SoC 170 may include vision processing units (VPUs) and/or other AI/NN-specific processors such as AI accelerator 148, etc. In some embodiments, any aspect of the embodiments described herein may be implemented in the processors and/or accelerators dedicated to AI and/or NN processing such as AI accelerator 148, the graphics processor 162 and/or the host processor 160.

The host processor 160, the graphics processor 162, the FPGA 178 and/or the IO module 166 may execute instructions 156 retrieved from the system memory 164 and/or the mass storage. When the instructions 156 are executed, the computing system 158 may implement one or more aspects of the embodiments described herein. For example, the system 158 may implement and/or include one or more aspects of the process 100 (FIG. 1), the method 600 (FIG. 2), the architecture 300 (FIG. 3), the architecture 400 (FIG. 4), the memory cells 502-504 (FIG. 5), already discussed.

The illustrated computing system 158 is therefore considered to be performance-enhanced at least to the extent that it enables the computing system 158 to take advantage of low latency memory accesses and storage at reduced footprint and hardware cost. Thus, some embodiments may increase throughput while also reducing a size of the package.

Figure 7:
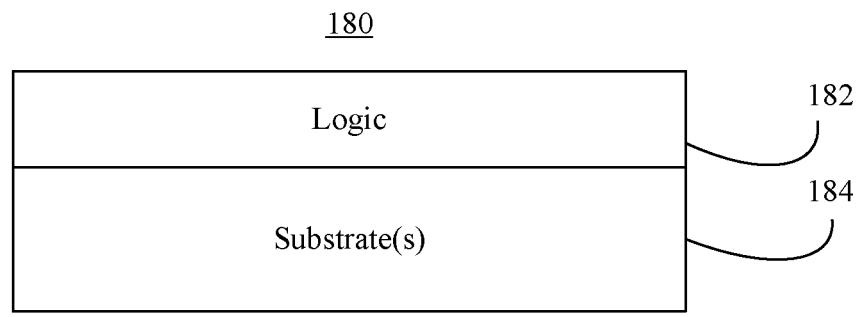
FIG. 7 is an illustration of an example of a semiconductor apparatus according to an embodiment.

FIG. 7 shows a semiconductor apparatus 180 (e.g., chip, die, package). The illustrated apparatus 180 includes one or more substrates 184 (e.g., silicon, sapphire, gallium arsenide) and logic 182 (e.g., transistor array and other integrated circuit/IC components) coupled to the substrate(s) 184. In an embodiment, the apparatus 180 is operated in an application development stage and the logic 182 implements and/or includes one or more aspects of the process 100 (FIG. 1), the method 600 (FIG. 2), the architecture 300 (FIG. 3), the architecture 400 (FIG. 4), the memory cells 502-504 (FIG. 5), already discussed. Thus, the logic 182 may store buckets that represent a plurality of clusters in a cache, where each of the buckets is to represent a group of the plurality of clusters and further where the plurality of clusters is in a first data format, modify input data from a second data format to the first data format and conduct a similarity search based on the input data in the first data format to assign the input data to at least one bucket of the buckets. Furthermore, the logic 182 may further include processors (not shown) and/or AI accelerator dedicated to artificial intelligence AI and/or NN processing. For example, the system logic 182 may include VPUs, and/or other AI/NN-specific processors such as AI accelerators, etc. In some embodiments, any aspect of the embodiments described herein may be implemented in the processors and/or accelerators dedicated to AI and/or NN processing such as AI accelerators.

The logic 182 may be implemented at least partly in configurable logic or fixed-functionality hardware logic. In one example, the logic 182 includes transistor channel regions that are positioned (e.g., embedded) within the substrate(s) 184. Thus, the interface between the logic 182 and the substrate(s) 184 may not be an abrupt junction. The logic 182 may also be considered to include an epitaxial layer that is grown on an initial wafer of the substrate(s) 184.

Figure 8:
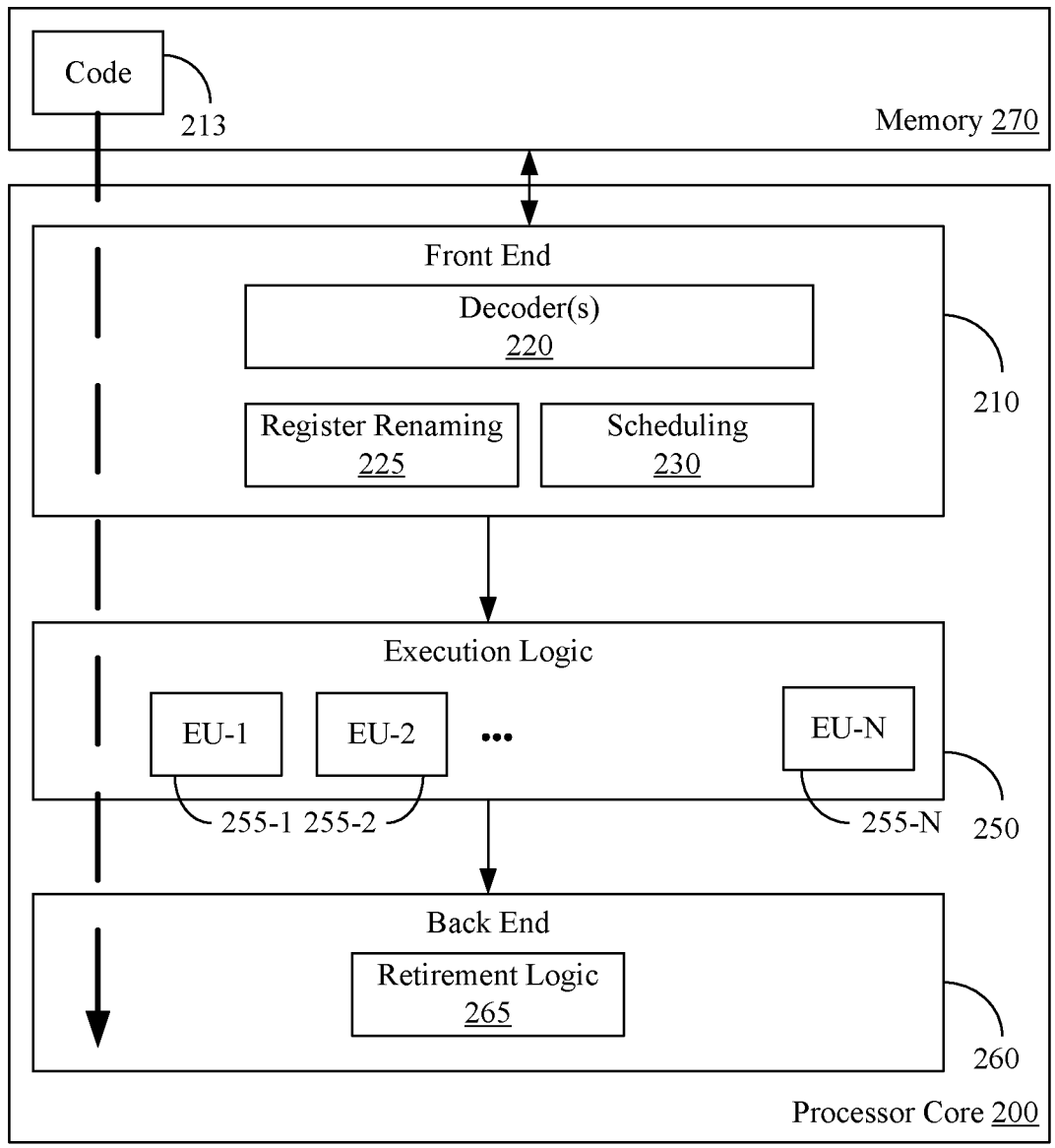
FIG. 8 is a block diagram of an example of a processor according to an embodiment.

FIG. 8 illustrates a processor core 200 according to one embodiment. The processor core 200 may be the core for any type of processor, such as a micro-processor, an embedded processor, a digital signal processor (DSP), a network processor, or other device to execute code. Although only one processor core 200 is illustrated in FIG. 8, a processing element may alternatively include more than one of the processor core 200 illustrated in FIG. 8. The processor core 200 may be a single-threaded core or, for at least one embodiment, the processor core 200 may be multithreaded in that it may include more than one hardware thread context (or "logical processor") per core.

FIG. 8 also illustrates a memory 270 coupled to the processor core 200. The memory 270 may be any of a wide variety of memories (including various layers of memory hierarchy) as are known or otherwise available to those of skill in the art. The memory 270 may include one or more code 213 instruction(s) to be executed by the processor core 200, wherein the code 213 may implement and/or include one or more aspects of the process 100 (FIG. 1), the method 600 (FIG. 2), the architecture 300 (FIG. 3), the architecture 400 (FIG. 4), the memory cells 502-504 (FIG. 5), already discussed. The processor core 200 follows a program sequence of instructions indicated by the code 213. Each instruction may enter a front end portion 210 and be processed by one or more decoders 220. The decoder 220 may generate as its output a micro operation such as a fixed width micro operation in a predefined format, or may generate other instructions, microinstructions, or control signals which reflect the original code instruction. The illustrated front end portion 210 also includes register renaming logic 225 and scheduling logic 230, which generally allocate resources and queue the operation corresponding to the convert instruction for execution.

The processor core 200 is shown including execution logic 250 having a set of execution units 255-1 through 255-N. Some embodiments may include a number of execution units dedicated to specific functions or sets of functions. Other embodiments may include only one execution unit or one execution unit that can perform a particular function. The illustrated execution logic 250 performs the operations specified by code instructions.

After completion of execution of the operations specified by the code instructions, back end logic 260 retires the instructions of the code 213. In one embodiment, the processor core 200 allows out of order execution but requires in order retirement of instructions. Retirement logic 265 may take a variety of forms as known to those of skill in the art (e.g., re-order buffers or the like). In this manner, the processor core 200 is transformed during execution of the code 213, at least in terms of the output generated by the decoder, the hardware registers and tables utilized by the register renaming logic 225, and any registers (not shown) modified by the execution logic 250.

Although not illustrated in FIG. 8, a processing element may include other elements on chip with the processor core 200. For example, a processing element may include memory control logic along with the processor core 200. The processing element may include I/O control logic and/or may include I/O control logic integrated with memory control logic. The processing element may also include one or more caches.

Referring now to FIG. 9, shown is a block diagram of a computing system 1000 embodiment in accordance with an embodiment. Shown in FIG. 9 is a multiprocessor system 1000 that includes a first processing element 1070 and a second processing element 1080. While two processing elements 1070 and 1080 are shown, it is to be understood that an embodiment of the system 1000 may also include only one such processing element.

The system 1000 is illustrated as a point-to-point interconnect system, wherein the first processing element 1070 and the second processing element 1080 are coupled via a point-to-point interconnect 1050. It should be understood that any or all of the interconnects illustrated in FIG. 9 may be implemented as a multi-drop bus rather than point-to-point interconnect.

As shown in FIG. 9, each of processing elements 1070 and 1080 may be multicore processors, including first and second processor cores (i.e., processor cores 1074a and 1074b and processor cores 1084a and 1084b). Such cores 1074a, 1074b, 1084a, 1084b may be configured to execute instruction code in a manner similar to that discussed above in connection with FIG. 8.

Each processing element 1070, 1080 may include at least one shared cache 1896a, 1896b. The shared cache 1896a, 1896b may store data (e.g., instructions) that are utilized by one or more components of the processor, such as the cores 1074a, 1074b and 1084a, 1084b, respectively. For example, the shared cache 1896a, 1896b may locally cache data stored in a memory 1032, 1034 for faster access by components of the processor. In one or more embodiments, the shared cache 1896a, 1896b may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the embodiments are not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to processor a first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, micro architectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

The first processing element 1070 may further include memory controller logic (MC) 1072 and point-to-point (P-P) interfaces 1076 and 1078. Similarly, the second processing element 1080 may include a MC 1082 and P-P interfaces 1086 and 1088. As shown in FIG. 9, MC's 1072 and 1082 couple the processors to respective memories, namely a memory 1032 and a memory 1034, which may be portions of main memory locally attached to the respective processors. While the MC 1072 and 1082 is illustrated as integrated into the processing elements 1070, 1080, for alternative embodiments the MC logic may be discrete logic outside the processing elements 1070, 1080 rather than integrated therein.

The first processing element 1070 and the second processing element 1080 may be coupled to an I/O subsystem 1090 via P-P interconnects 1076 1086, respectively. As shown in FIG. 9, the I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, bus 1049 may be used to couple the graphics engine 1038 to the I/O subsystem 1090. Alternately, a point-to-point interconnect may couple these components.

In turn, I/O subsystem 1090 may be coupled to a first bus 1016 via an interface 1096. In one embodiment, the first bus 1016 may be a Peripheral Component Interconnect (PCI) bus, or a bus such as a PCI Express bus or another third generation I/O interconnect bus, although the scope of the embodiments are not so limited.

As shown in FIG. 9, various I/O devices 1014 (e.g., biometric scanners, speakers, cameras, sensors) may be coupled to the first bus 1016, along with a bus bridge 1018 which may couple the first bus 1016 to a second bus 1020. In one embodiment, the second bus 1020 may be a low pin count (LPC) bus. Various devices may be coupled to the second bus 1020 including, for example, a keyboard/mouse 1012, communication device(s) 1026, and a data storage unit 1019 such as a disk drive or other mass storage device which may include code 1030, in one embodiment. The illustrated code 1030 may implement one or more aspects of the process 100 (FIG. 1), the method 600 (FIG. 2), control of architecture 300 (FIG. 3) and/or control of the architecture 400 (FIG. 4) and/or the memory cells 502-504 (FIG. 5), already discussed. Further, an audio I/O 1024 may be coupled to second bus 1020 and a battery 1010 may supply power to the computing system 1000.

Note that other embodiments are contemplated. For example, instead of the point-to-point architecture of FIG. 9, a system may implement a multi-drop bus or another such communication topology. Also, the elements of FIG. 9 may alternatively be partitioned using more or fewer integrated chips than shown in FIG. 9.

Additional Notes and Examples

Example 1 includes a computing system comprising a system-on-chip that includes a plurality of registers, and access circuitry to access the plurality of registers, wherein the plurality of registers includes a first portion dedicated to write operations and a second portion dedicated to read operations, and a memory including a set of executable program instructions, which when executed by the system-on-chip, cause the computing system to write data to the first portion of the plurality of registers, and transfer the data from the first portion to the second portion.

Example 2 includes the computing system of Example 1, wherein the instructions, when executed, further cause the computing system to transfer the data in response to a transfer clock pulse being identified.

Example 3 includes the computing system of Example 2, wherein the instructions, when executed, further cause the computing system to write the data to the first portion during one or more first clock cycles prior to the transfer clock pulse being identified.

Example 4 includes the computing system of Example 3, wherein the instructions, when executed, further cause the computing system to read the data in the first portion during one or more second clock cycles after the transfer clock pulse is identified.

Example 5 includes the computing system of Example 1, wherein the plurality of registers is to include a first register that is to be associated with input features associated with a neural network, a second register that is to be associated with filters associated with the neural network, and a third register that is to be associated with output features associated with the neural network.

Example 6 includes the computing system of any one of Examples 1 to 5, wherein the instructions, when executed, further cause the computing system to in each of a plurality of consecutive clock cycles, retrieve data from a memory and store the retrieved data in the first portion.

Example 7 includes the computing system of any one of Examples 1 to 5, wherein the instructions, when executed, further cause the computing system to in each of a plurality of consecutive clock cycles, read data from the second portion.

Example 8 includes the computing system of Example 1, wherein the instructions, when executed, further cause the computing system to control read and write operations to the first and second portions based on a first clock signal, and transfer data between the first and second portions based on a second clock signal that is to be different from the first clock signal.

Example 9 includes a semiconductor apparatus comprising one or more substrates, and logic coupled to the one or more substrates, wherein the logic is implemented in one or more of configurable logic or fixed-functionality logic hardware, the logic coupled to the one or more substrates to identify a plurality of registers that is associated with a system-on-chip, wherein the plurality of registers includes a first portion dedicated to write operations and a second portion dedicated to read operations, write data to the first portion of the plurality of registers, and transfer the data from the first portion to the second portion.

Example 10 includes the apparatus of Example 9, wherein the logic coupled to the one or more substrates is to transfer the data in response to a transfer clock pulse being identified.

Example 11 includes the apparatus of Example 10, wherein the logic coupled to the one or more substrates is to write the data to the first portion during one or more first clock cycles prior to the transfer clock pulse being identified.

Example 12 includes the apparatus of Example 11, wherein the logic coupled to the one or more substrates is to read the data in the first portion during one or more second clock cycles after the transfer clock pulse is identified.

Example 13 includes the apparatus of Example 9, wherein the plurality of registers is to include a first register that is to be associated with input features associated with a neural network, a second register that is to be associated with filters associated with the neural network, and a third register that is to be associated with output features associated with the neural network.

Example 14 includes the apparatus of any one of Examples 9 to 13, wherein the logic coupled to the one or more substrates is to in each of a plurality of consecutive clock cycles, retrieve data from a memory and store the retrieved data in the first portion.

Example 15 includes the apparatus of any one of Examples 9 to 13, wherein the logic coupled to the one or more substrates is to in each of a plurality of consecutive clock cycles, read data from the second portion.

Example 16 includes the apparatus of Example 9, wherein the logic coupled to the one or more substrates is to control read and write operations to the first and second portions based on a first clock signal, and transfer data between the first and second portions based on a second clock signal that is to be different from the first clock signal.

Example 17 includes the apparatus of Example 9, wherein the logic coupled to the one or more substrates includes transistor channel regions that are positioned within the one or more substrates.

Example 18 includes a method comprising identifying a plurality of registers that are associated with a system-on-chip, wherein the plurality of registers includes a first portion dedicated to write operations and a second portion dedicated to read operations, writing data to the first portion of the plurality of registers, and transferring the data from the first portion to the second portion.

Example 19 includes the method of Example 18, further comprising transferring the data in response to a transfer clock pulse being identified.

Example 20 includes the method of Example 19, further comprising writing the data to the first portion during one or more first clock cycles prior to the transfer clock pulse being identified.

Example 21 includes the method of Example 20, further comprising reading the data in the first portion during one or more second clock cycles after the transfer clock pulse is identified.

Example 22 includes the method of Example 18, wherein the plurality of registers includes a first register associated with input features associated with a neural network, a second register associated with filters associated with the neural network, and a third register associated with output features associated with the neural network.

Example 23 includes the method of any one of Examples 18 to 22, further comprising in each of a plurality of consecutive clock cycles, retrieving data from a memory and storing the retrieved data in the first portion.

Example 24 includes the method of any one of Examples 18 to 22, further comprising in each of a plurality of consecutive clock cycles, reading data from the second portion.

Example 25 includes the method of Example 18, further comprising controlling read and write operations to the first and second portions based on a first clock signal, and transferring data between the first and second portions based on a second clock signal that is different from the first clock signal.

Example 26 includes a semiconductor apparatus comprising means for identifying a plurality of registers that are associated with a system-on-chip, wherein the plurality of registers is to include a first portion dedicated to write operations and a second portion dedicated to read operations, means for writing data to the first portion of the plurality of registers, and means for transferring the data from the first portion to the second portion.

Example 27 includes the apparatus of Example 26, further comprising means for transferring the data in response to a transfer clock pulse being identified.

Example 28 includes the apparatus of Example 27, further comprising means for writing the data to the first portion during one or more first clock cycles prior to the transfer clock pulse being identified.

Example 29 includes the apparatus of Example 28, further comprising means for reading the data in the first portion during one or more second clock cycles after the transfer clock pulse is identified.

Example 30 includes the apparatus of Example 26, wherein the plurality of registers is to include a first register associated with input features associated with a neural network, a second register associated with filters associated with the neural network, and a third register associated with output features associated with the neural network.

Example 31 includes the apparatus of any one of Examples 26 to 30, further comprising in each of a plurality of consecutive clock cycles, means for retrieving data from a memory and storing the retrieved data in the first portion.

Example 32 includes the apparatus of any one of Examples 26 to 30, further comprising in each of a plurality of consecutive clock cycles, means for reading data from the second portion.

Example 33 includes the apparatus of Example 26, further comprising means for controlling read and write operations to the first and second portions based on a first clock signal, and means for transferring data between the first and second portions based on a second clock signal that is to be different from the first clock signal.

Thus, technology described herein may provide for an enhanced memory access method and multi-buffered system. Furthermore, technology may reduce the size, complexity and hardware of registers and memory architectures.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A computing system comprising:
a system-on-chip that includes a plurality of registers, and access circuitry to access the plurality of registers, wherein the plurality of registers includes a first portion dedicated to write operations and a second portion dedicated to read operations; and
a memory including a set of executable program instructions, which when executed by the system-on-chip, cause the computing system to:
write data to the first portion of the plurality of registers as part of the write operations;
control the write operations for writing data into the first portion based on a first clock signal;
control the read operations for reading data from the second portion based on the first clock signal; and control data transfer from the first portion to the second portion based on a second clock signal, wherein the second clock signal is different from the first clock signal.

2. The computing system of claim 1, wherein the instructions, when executed, further cause the computing system to execute the data transfer from the first portion to the second portion in response to a pulse of the second clock signal being identified.

3. The computing system of claim 2, wherein the instructions, when executed, further cause the computing system to:
write the data to the first portion by writing the data to the first portion during one or more first close cycles of the first clock signal prior to the pulse of the second clock signal being identified.

4. The computing system of claim 3, wherein the instructions, when executed, further cause the computing system to:
read, as part of the read operations, the data in the second portion during one or more clock cycles of the first clock signal after the pulse is identified.

5. The computing system of claim 1, wherein the plurality of registers is to include:
a first register that is to be associated with input features associated with a neural network,
a second register that is to be associated with filters associated with the neural network, and
a third register that is to be associated with output features associated with the neural network.

6. The computing system of claim 1, wherein the instructions, when executed, further cause the computing system to:
in each of a plurality of consecutive clock cycles of the first clock signal, retrieve further data from a storage and store the retrieved further data in the first portion.

7. The computing system of claim 1, wherein the instructions, when executed, further cause the computing system to:
in each of a plurality of consecutive clock cycles of the first clock signal, read further data from the second portion as part of the read operations.

8. A semiconductor apparatus comprising:
one or more substrates; and
logic coupled to the one or more substrates, wherein the logic is implemented in one or more of configurable logic or fixed-functionality logic hardware, the logic coupled to the one or more substrates to:
identify a plurality of registers that is associated with a system-on-chip, wherein the plurality of registers include a first portion dedicated to write operations and a second portion dedicated to read operations;
write data to the first portion of plurality of registers as part of the write operations;
control the write operations for writing data into the first portion based on a first clock signal;
control the read operations for reading data from the second portion based on the first clock signal; and
control data transfer from the first portion to the second portion based on a second clock signal, wherein the second clock signal is different from the first clock signal.

9. The apparatus of claim 8, wherein the logic coupled to the one or more substrates is further to:
execute the data transfer from the first portion to the second portion in response to a pulse of the second clock signal being identified.

10. The apparatus of claim 9, wherein the logic coupled to the one or more substrates is to:
write the data to the first portion by writing the data to the first portion during one or more first close cycles of the first clock signal prior to the pulse of the second clock signal being identified.

11. The apparatus of claim 10, wherein the logic coupled to the one or more substrates is to:
read, as part of the read operations, the data in the second portion during one or more clock cycles of the first clock signal after the pulse is identified.

12. The apparatus of claim 8, where in the plurality of registers is to include:
a first register that is to be associated with the input features associated with a neural network,
a second register that is to be associated with filters associated with the neural network, and
a third register that is to be associated with output features associated with the neural network.

13. The apparatus of claim 8, wherein the logic coupled to the one or more substrates is to:
in each of a plurality of consecutive clock cycles of the first clock signal, retrieve further data from a storage and store the retrieved further data in the first place.

14. The apparatus of claim 8, wherein the logic coupled to the one or more substrates is to:
in each of a plurality of consecutive clock cycles of the first clock signal, read further data from the second portion as part of the read operations.

15. The apparatus of claim 8, wherein the logic coupled to the one or more substrates includes transistor channel regions that are positioned within one or more substrates.

16. A method comprising:
identifying a plurality of registers that are associated with a system-on-chip, wherein the plurality of registers includes a first portion dedicated to write operations and a second portion dedicated to read operations;
writing data to the first portion of the plurality of registers as part of the write operations;
controlling the write operations for writing data into the first portion based on a first clock signal;
controlling the read operations for reading data from the second portion based on the first clock signal; and
controlling data transfer from the first portion to the second portion based on a second clock signal, wherein the second clock signal is different from the first clock signal.

17. The method of claim 16, further comprising:
executing the data transfer from the first portion to the second portion in a response to a pulse of the second clock signal being identified.

18. The method of claim 17, wherein writing the data to the first portion comprises writing the data to the first portion during one or more first clock cycles of the first clock signal prior to the pulse of the second clock signal being identified.

19. The method of claim 18, further comprising:
reading, as part of the read operations, the data in the second portion during one or more clock cycles of the first clock signal after the pulse is identified.

20. The method of claim 16, wherein the plurality of registers includes:
a first register associated with input features associated with a neural network,
a second register associated with filters associated with a neural network, and
a third register associated with output features associated with the neural network.

21. The method of claim 16, further comprising:
in each of a plurality of consecutive clock cycles of the first clock signal, retrieving further data from a storage and storing is retrieved further data in the first portion.

22. The method of claim 16, further comprising:
in each of a plurality of consecutive clock cycles of the first clock signal, reading further data from the second portion as part of the read operations.

* * * * *

UNITED STATES PATENT AND TRADEMARK OFFICE
CERTIFICATE OF CORRECTION

| | | |
|---|---|---|
| PATENT NO. | : 12,386,618 B2 | Page 1 of 1 |
| APPLICATION NO. | : 17/132895 | |
| DATED | : August 12, 2025 | |
| INVENTOR(S) | : Steven K. Hsu et al. | |

It is certified that error appears in the above-identified patent and that said Letters Patent is hereby corrected as shown below:

In the Claims

In Column 18, Claim 12, Line 12, delete "where in" and insert -- wherein --, therefor.

In Column 18, Claim 17, Line 50, delete "a response" and insert -- response --, therefor.

Signed and Sealed this
Eighteenth Day of November, 2025

John A. Squires
*Director of the United States Patent and Trademark Office*